(12) United States Patent
Saitou

(10) Patent No.: US 7,223,637 B2
(45) Date of Patent: May 29, 2007

(54) METHOD OF MANUFACTURING A SENSOR DEVICE WITH BINDING MATERIAL HAVING A FOAMING AGENT

(75) Inventor: Takashige Saitou, Ama-gun (JP)

(73) Assignee: Denso Corporation, Kariya (JP)

( * ) Notice: Subject to any disclaimer, the term of this patent is extended or adjusted under 35 U.S.C. 154(b) by 145 days.

(21) Appl. No.: 11/046,793

(22) Filed: Feb. 1, 2005

(65) Prior Publication Data

US 2005/0173810 A1  Aug. 11, 2005

(30) Foreign Application Priority Data

Feb. 10, 2004  (JP)  ............... 2004-033087

(51) Int. Cl.
*H01L 21/00* (2006.01)
(52) U.S. Cl. ............... 438/118; 257/782; 257/783; 257/784; 257/785; 257/786; 438/617
(58) Field of Classification Search ........... 257/324, 257/777, 783, 782
See application file for complete search history.

(56) References Cited

U.S. PATENT DOCUMENTS 5,483,106 A * 1/1996 Echigo et al. ............. 257/783

| | | | |
|---|---|---|---|
| 6,486,003 B1 | 11/2002 | Fjelstad | |
| 6,503,780 B1 * | 1/2003 | Glenn et al. | ............... 438/116 |
| 6,593,663 B2 | 7/2003 | Ikezawa et al. | |
| 2001/0055836 A1 | 12/2001 | Kunda | |
| 2003/0006508 A1 | 1/2003 | Ikezawa et al. | |
| 2003/0024113 A1 * | 2/2003 | Scher et al. | ............... 29/840 |

OTHER PUBLICATIONS

Notice of Preliminary Rejection from Korean Patent Office issued on Apr. 26, 2006 for the corresponding Korean patent application No. 10-2005-0009188 (a copy and English translation thereof).

Office Communication from European Patent Office issued on Oct. 20, 2006 for the corresponding European patent application No. 05 002 056.9-2213 (a copy thereof).

* cited by examiner

*Primary Examiner*—Evan Pert
*Assistant Examiner*—Tan Tran
(74) *Attorney, Agent, or Firm*—Posz Law Group, PLC

(57) ABSTRACT

A sensor device includes a sensor chip and a bonding wire being fixed on a substrate. The sensor device is manufactured by using a binding material made of an adhesive containing a foaming agent that evaporates upon exposure to heat. The binding material reduces its elasticity after a wire bonding process because voids being functional as a cushion are formed by evaporation of the foaming agent.

4 Claims, 1 Drawing Sheet

METHOD OF MANUFACTURING A SENSOR DEVICE WITH BINDING MATERIAL HAVING A FOAMING AGENT

CROSS REFERENCE TO RELATED APPLICATION

This application is based upon, claims the benefit of priority of, and incorporates by reference the contents of, Japanese Patent Application No. 2004-33087 filed on Feb. 10, 2004.

FIELD OF THE INVENTION

The present invention relates to a sensor device having a sensor chip and a bonding wire fixed by a binding material on a substrate used as a case, a circuit board or a lead frame.

BACKGROUND OF THE INVENTION

A conventional sensor device is disclosed in, for example, U.S. Pat. No. 6,593,663, the contents of which are incorporated herein by reference. The acceleration sensor includes a sensor chip for sensing acceleration by a sensor portion disposed on a substrate made of silicon or the like, and a circuit chip as a base substrate mounting the sensor chip thereon by using an adhesive film.

In this type of conventional sensor device, the sensor chip is connected to the substrate by a bonding wire. That is, the sensor chip is wire-bonded to the substrate.

The conventional sensor device described above uses a binding material made of silicon resin or the like with minimum elasticity to protect the sensor chip fixed on the substrate from stress. In this manner, the sensitivity of the sensor device is improved.

However, the modulus of elasticity of the binding material, e.g. an adhesive film, has to be 1 MPa or more in order to stably support the sensor chip when the wire is bonded on the chip.

Therefore, the sensitivity of the conventional sensor device is restricted by the modulus of elasticity of the binding material. In other words, there is a trade-off between the sensitivity of the sensor and the elasticity of the binding material in the conventional sensor device.

In other words, it is necessary to use a less elastic binding material in order to further increase the sensitivity of the sensor device. This is because the stress transfer from the substrate to the sensor chip has to be decreased by using less elastic binding material, for example, with the modulus of elasticity being 1 MPa or less.

The less elastic binding material, however, causes a problem in a wire bonding process. That is, the wire bonding process can't be stably conducted when the binding material is too low in the modulus of elasticity (too soft).

SUMMARY OF THE INVENTION

In view of the above-described problems, it is an object to provide a sensor device including a sensor chip and a bonding wire fixed on a substrate by a binding material suitable for both increased sensitivity and a wire bonding process.

Accordingly, a sensor device of the present embodiment includes a sensor chip that is fixed on a substrate by a binding material and has a bonding wire connected thereto. A binding material that loses elasticity on application of energy in comparison to pre-energized state is used.

That is, the binding material is made less elastic when energized than in the pre-energized state. The binding material is elastic enough to stably support the sensor chip on the substrate for a wire bonding process in a pre-energized state. The binding material is then energized to be less elastic after the wire bonding process.

Therefore, the elasticity of the binding material becomes much lower than the one being used in the conventional art in terms of preventing stress transfer to the sensor chip.

Therefore, the sensor device having a sensor chip being fixed on a substrate by a binding material and having a bonding wire connected thereto can be wire-bonded and can also have an increased sensitivity.

In the sensor device of the present embodiment, the binding material is has the following characteristics. That is, the energized binding material is functional as a cushion with air voids contained therein. In the energizing process, heat is used as a source of energy. The binding material is made of an adhesive containing a foaming agent that evaporates on application of heat.

After the sensor chip is fixed on the substrate and wire-bonded, the binding material is heated to evaporate the foaming agent in the adhesive for forming air voids. As a result, the heated binding material becomes less elastic because of the air voids contained therein are functional as a cushion.

In the sensor device, the foaming agent is made of either of an Azodicarbonamide, a Di-nitrosopentamethylenetetramin, a Benzenesulphonyl hydrazide or a mixture of these materials.

BRIEF DESCRIPTION OF THE DRAWINGS

Other objects, features and advantages of the present invention will become more apparent from the following detailed description made with reference to the accompanying drawings, in which.

DETAILED DESCRIPTION OF THE PREFERRED EMBODIMENTS

Figure 1:
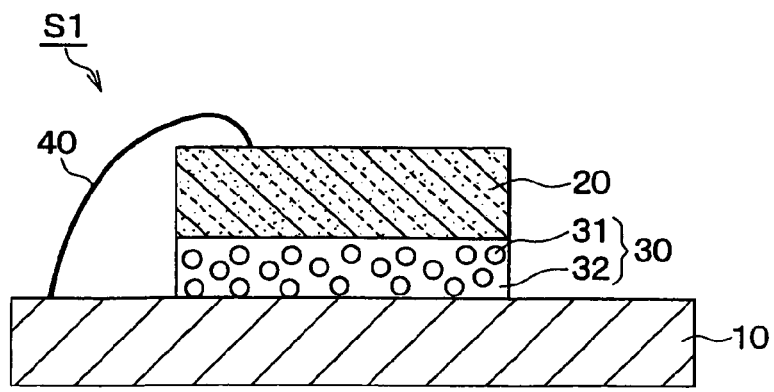
FIG. 1 is a schematical cross-sectional view of an acceleration sensor according to a preferred embodiment.

The following is a description of preferred embodiments with reference to drawings. Same numerals in the drawings designate the same or equivalent thing in the drawings for brevity of explanation.

An acceleration sensor S1 according to a preferred embodiment is illustrated in FIG. 1. The acceleration sensor S1 may be implemented within, for example, a driving control system on an automotive vehicle, although the acceleration sensor is not necessarily limited to being implemented within such a device.

A substrate 10 shown in FIG. 1 is a component such as a case, a housing, a printed circuit substrate/ceramic substrate or a lead frame may be utilized. A material for the substrate 10 may be, though not necessarily limited, resin, ceramic or metal. When the substrate 10 is used as a part of the case or the housing, the case or the housing has a conducting portion to be connected to a bonding wire 40.

The substrate 10 has a sensor chip 20 mounted thereon. The sensor chip 20 is attached to and fixed to the substrate 10 by a binding material 30.

The sensor chip 20 and the substrate 10 are electrically connected by the bonding wire 40. The bonding wire 40 is formed in a wire bonding process that uses gold, aluminum or the like as a material of the bonding wire 40.

The sensor chip 20 is, in this case, used as an acceleration sensor. A beam structure with a comb portion of well-known type is formed on a silicon substrate or the like to pick up changes of an interelectrode capacitance (electric signal) between a movable electrode and a fixed electrode being proportional to acceleration.

The electric signal from the sensor chip 20 is, for example, converted by a C/V conversion circuit on the substrate 10 to variations of voltage, and then is output to an external circuit as an acceleration signal through the bonding wire 40 after being treated in processes such as amplification, adjustment and the like.

The binding material 30 that attaches the sensor chip 20 to the substrate 10 is made of a material that reduces elasticity on an application of energy, such as heat, light or the like, while fixing the sensor chip 20 to the substrate 10, that is, while maintaining the functionality of an adhesive.

In a finished state of the acceleration sensor S1, the binding material 30 is already energized to have the modulus of elasticity of, for example, approximately 0.5 MPa, being much lower than a material used in a conventional sensor device.

The binding material 30 is, as shown in FIG. 1, functional as a cushion because of voids 31 of air contained therein. In other words, the binding material of the conventional sensor device is homogeneous without any void contained therein, while the binding material 30 in the present embodiment is heterogeneous with the voids 31 contained therein to be functional as a cushion.

Figure 2A:
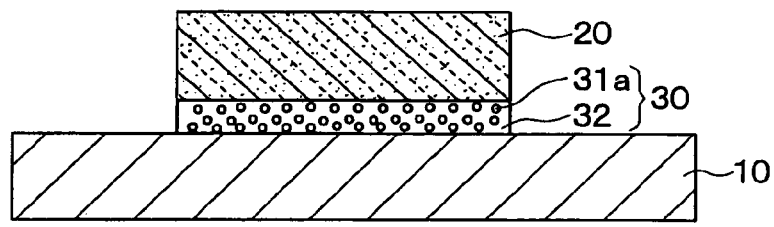
FIGS. 2A to 2C are side views of a manufacturing process of the acceleration sensor shown in FIG. 1.

The binding material 30 is made of, for example, an adhesive 32 containing a foaming agent 31a that evaporates on application of heat (as shown in FIG. 2A). The binding material 30 of this kind contains the voids 31 when heat is applied to evaporate the foaming agent 31a in the adhesive 32.

The foaming agent 31a in the binding material 30 is made of, for example, a material such as an Azodicarbonamide, a Di-nitrosopentamethylenetetramin, a Benzenesulphonyl hydrazide, a mixture of these materials or the like. The adhesive 32 is, for example, a thermosetting resin adhesive made of a silicon type resin with the modulus of elasticity of approximately 1 MPa.

The foaming agent 31a is, for example, contained in the adhesive 32 as a powder. A mixture ratio having a preferable post-heating elasticity can be easily determined by those who are skilled in the art, based on the type and the elasticity of the adhesive 32.

Figure 2B:
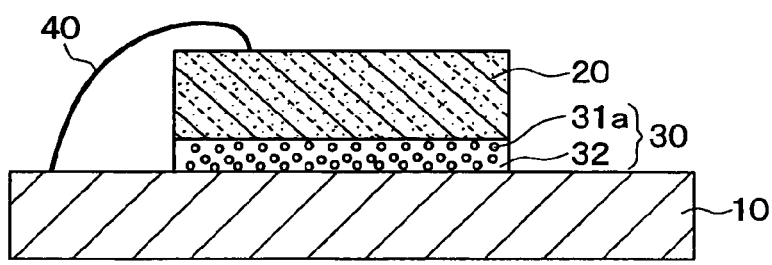
Figure 2C:
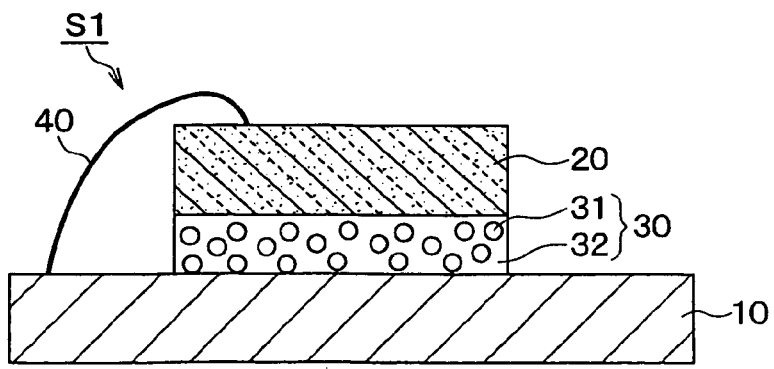

A method for manufacturing the acceleration sensor S1 will now be explained with reference to FIGS. 2A to 2C. FIGS. 2A to 2C are schematical cross-sectional views of a manufacturing process of the acceleration sensor S1 illustrating how components are structured.

First, as shown in FIG. 2A, the binding material 30 is placed on the substrate 10. The binding material 30 made of the adhesive 32 containing the powdered foaming agent 31a is, as described above, applied to the substrate 10 by a dispense method or the like.

In this case, the evaporative foaming agent 31a on application of heat, being made of a material such as an Azodicarbonamide, a Di-nitrosopentamethylenetetramin, a Benzenesulphonyl hydrazide or the like, is mixed in the silicon type adhesive 32 with the modulus of elasticity of 1 MPa.

Next, the sensor chip 20 is placed on the binding material 30, and is treated in a heating process and the like to harden the binding material 30. At this stage, the adhesive 32 in the binding material 30 hardens while the foaming agent 31a stays in a solid state (powder).

Then, as shown in FIG. 2B, the wire bonding process is executed. The bonding wire 40 is bonded to the sensor chip 20 and the substrate 10 to electrically connect the chip 20 and the substrate 10. The foaming agent 31a is still in a solid state (powder).

Further, as shown in FIG. 2C, the chip 20 fixed on the substrate by the binding material 30 is heated, for example, to 200° C. In this process, the foaming agent 31a in the adhesive 32 evaporates and forms the voids 31. This completes the manufacturing process of the acceleration sensor S1 in this embodiment.

In this embodiment, the sensor device S1, including the sensor chip 20 being fixed on the substrate 10 by the binding material 30 and having the bonding wire 40 connected thereto, is characterized by the binding material 30 that reduces elasticity when energy is applied to the material 30.

The binding material 30 fulfills the following requirements because the material 30 reduces elasticity when energy is applied. That is, the material 30 is elastic (hard enough) to stably support the sensor chip 20 fixed on the substrate 10 in the wire bonding process. The binding material 30 reduces elasticity after the wire bonding process on application of energy.

Therefore, the modulus of elasticity of the binding material 30 is 1 MPa or more in the wire bonding process, and the modulus of elasticity is reduced to approximately 0.5 MPa after the wire bonding process.

In this embodiment, the elasticity of the binding material 30 can be reduced to a level that is not sufficiently elastic (hard enough) to conduct the wire bonding. In other words, the elasticity of the binding material 30 can be lowered to an unprecedented level, thereby also lowering the stress transfer level to the sensor chip 20.

Therefore, in the sensor device of the present embodiment, including the sensor chip 20 being fixed on the substrate 10 by the binding material 30 and having the bonding wire 40 connected thereto, the sensor chip 20 can be wire-bonded while sensitivity of the sensor device can be increased.

The binding material 30 of the sensor device S1 in this embodiment is being functional as a cushion by containing the voids 31 of air as shown in FIG. 1.

More practically, the binding material 30 is made of the silicon type adhesive 32 containing the foaming agent 31a such as an Azodicarbonamide, a Di-nitrosopentamethylene-tetramin, a Benzenesulphonyl hydrazide or a mixture of these materials to provide the required characteristics described above.

The above-described binding material 30 forms the voids 31 by evaporation of the foaming agent 31a in the adhesive 32 on application of heat to the material 30 after the sensor chip 20 is fixed on and wire-bonded to the substrate 10.

Therefore, the binding material 30 preferably becomes heterogeneous and functional as a cushion after heating because of the voids 31 of air formed therein. As a result, the elasticity of the material 30 reduces.

The extremely low elasticity of the binding material 30 required in this embodiment can only be achieved, for example, by using a gel type material when the material is homogeneous without voids as in the conventional art. In this case, the elasticity is too low to stably conduct a wire bonding process on a sensor chip.

In this embodiment, the foaming agent 31*a* in the adhesive 32 evaporates on application of heat to form the voids 31. The voids 31 may also be formed by a light-sensitive foaming agent or the like.

OTHER EMBODIMENT

In the above embodiment, the binding material with an extremely low elasticity is provided by forming voids on application of heat or light. The binding material with this characteristic, reduction of elasticity on application of energy, is not necessarily provided in this manner.

For example, an adhesive that reduces elasticity on application of heat, light or the like, or an adhesive containing the material having that kind of characteristics may be used as the binding material. By using this kind of adhesive, the binding material of the present embodiment is suitably prepared because the elasticity of the adhesive is reduced by a chemical reaction or the like to an extremely low level on application of energy (such as heat or the like).

The binding material may also be made of an adhesive having an ingredient that evaporates or decomposes on application of heat, light or the like. The adhesive may include a material having this kind of characteristics as a mixture.

The binding material of this kind will have spaces similar to voids formed by evaporation or decomposition on application of energy. The void-like space will be functional as a cushion in the binding material to appropriately provide the extremely low elasticity required in the present invention.

In the present invention, the energy to be applied to the binding material may be, for example, an ultrasonic wave or the like. A binding material having a substance that decomposes on application of the ultrasonic wave will also be appropriately used in this embodiment.

An acceleration sensor is taken as an example in the explanation of the present embodiment. However, the present embodiment may also be applied to other types of sensors, such as an angular velocity sensor, a pressure sensor, a temperature sensor or a light sensor. That is, the sensor chip 20 may be an angular velocity sensing element, a pressure sensing element, a temperature sensing element or a light sensing element in the embodiment described above.

What is claimed is:

1. A method of manufacturing a sensor device comprising:

fixing a sensor chip to a substrate via a binding material such that an adhesive of the binding material hardens while a foaming agent of the binding material remains in a solid state;

bonding a wire to electrically connect the sensor chip and the substrate such that the foaming agent of the binding material remains in a solid state; and heating the binding material after the bonding of the wire to thereby evaporate the foaming agent and reduce the modulus of elasticity of the binding material from at least 1 MPa to below 1 MPa.

2. The method of claim 1, wherein the heating of the binding material further includes heating the binding material to thereby evaporate the foaming agent and thereby reduce the elasticity of the binding material from at least 1 MPa to approximately 0.5 MPa.

3. The method of claim 1, wherein the heating of the binding material further comprises heating the binding material to thereby evaporate the foaming agent and thereby introduce air voids in the binding material.

4. The method of claim 1, wherein the foaming agent is at least one of Azodicarbonamide, Di-nitrosopentamethylenetetramin, and Benzenesulphonyl hydrazide.

* * * * *